(12) United States Patent
Kim (10) Patent No.: US 7,732,258 B2
(45) Date of Patent: Jun. 8, 2010

(54) LEAD FRAME AND METHOD FOR FABRICATING SEMICONDUCTOR PACKAGE EMPLOYING THE SAME

(75) Inventor: Tae-Hun Kim, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/222,854

(22) Filed: Aug. 18, 2008

(65) Prior Publication Data
US 2008/0311705 A1 Dec. 18, 2008

Related U.S. Application Data

(62) Division of application No. 10/866,774, filed on Jun. 15, 2004, now abandoned.

(30) Foreign Application Priority Data
Nov. 6, 2003 (KR) ................................ 2003-78432

(51) Int. Cl.
*H01L 21/58* (2006.01)
*H01L 21/60* (2006.01)

(52) U.S. Cl. .................. 438/112; 438/123; 438/940; 257/E21.151

(58) Field of Classification Search ................ 438/111, 438/112, 123, 940, FOR. 367; 257/E21.51
See application file for complete search history.

(56) References Cited

U.S. PATENT DOCUMENTS 4,362,902 A * 12/1982 Grabbe ..................... 174/536
4,408,218 A * 10/1983 Grabbe ..................... 257/670
4,445,271 A * 5/1984 Grabbe ..................... 29/827

(Continued)

FOREIGN PATENT DOCUMENTS

JP 06244341 A * 9/1994

(Continued)

OTHER PUBLICATIONS

Office Action dated Jun. 13, 2008 for counterpart Chinese Application No. 200410089713.6 and English translation thereof.

(Continued)

*Primary Examiner*—George Fourson
(74) *Attorney, Agent, or Firm*—Harness, Dickey & Pierce, P.L.C.

(57) ABSTRACT

A lead frame and a method of fabricating a semiconductor package including the lead frame, where the lead frame includes a die pad, a tie bar supporting the die pad, and a plurality of leads. The leads may include inner and outer leads arranged along an outer periphery of the die pad, with each of the inner and outer leads having tip terminals. The lead frame may include a connecting bar connected to tip terminals of each of the inner leads. In the method, a bonding pad of a semiconductor chip is mounted on the die pad and connected via a conductive wire to the inner leads of the lead frame. The semiconductor chip, wire and inner leads may be subjected to a molding process, and the connecting bar which connects the tip terminals of the inner leads may be cut so as to independently separate each of the inner leads from the die pad.

8 Claims, 5 Drawing Sheets

U.S. PATENT DOCUMENTS

| | | | | |
|---|---|---|---|---|
| 5,096,852 | A | * | 3/1992 | Hobson ........................ 29/827 |
| 5,118,556 | A | * | 6/1992 | Makino et al. .............. 428/209 |
| 5,814,877 | A | * | 9/1998 | Diffenderfer et al. ....... 257/666 |
| 5,869,355 | A | * | 2/1999 | Fukaya ....................... 438/123 |
| 5,936,303 | A | * | 8/1999 | Nishi ......................... 257/675 |
| 6,586,821 | B1 | * | 7/2003 | Hundt et al. ................ 257/666 |
| 6,818,973 | B1 | * | 11/2004 | Foster ........................ 257/676 |
| 2002/0140061 | A1 | * | 10/2002 | Lee ............................ 257/666 |
| 2003/0006488 | A1 | | 1/2003 | Wakabayashi et al. |

FOREIGN PATENT DOCUMENTS

| | | | |
|---|---|---|---|
| JP | 08162588 | A * | 6/1996 |
| JP | 2000-286377 | A | 10/2000 |
| JP | 2001-15671 | | 1/2001 |
| JP | 2003-17645 | | 1/2003 |
| KR | 10-0014932 | | 7/1993 |
| KR | 20-0007358 | | 3/1995 |
| KR | 10-0348321 | | 7/2002 |

OTHER PUBLICATIONS

Chinese Office Action dated Dec. 7, 2007 for corresponding Chinese Patent Application No. 2004100897136 with English translation.
(Notice of examinatin Report)—Korean Search Report dated Aug. 31, 2005 with English translation.
Office Action dated Jan. 26, 2010 issued in corresponding Japanese Patent Application No. 2004-302218.

* cited by examiner

LEAD FRAME AND METHOD FOR FABRICATING SEMICONDUCTOR PACKAGE EMPLOYING THE SAME

PRIORITY STATEMENT

This application is a divisional of application Ser. No. 10/866,774, filed Jun. 15, 2004 now abandoned, which claims the priority of Korean Patent Application No. 2003-0078432, filed on Nov. 6, 2003 in the Korean Intellectual Property Office, the disclosure of each of which is incorporated herein by reference

BACKGROUND OF THE INVENTION

1. Field of the Invention

The present invention relates, in general, to a lead frame and a method for fabricating a semiconductor package employing the same.

2. Description of the Related Art

Technologies for fabricating a semiconductor package for electrically or electronically connecting a semiconductor chip to an external environment are largely classified into two technologies: fabricating a Quad Flat Package (QFP), and fabricating a Ball Grid Array (BGA).

A lead frame is conventionally employed in manufacturing the QFP. The lead frame supports the chip as a separate element, and provides a structure for transmitting the function of the semiconductor chip to an external circuit.

The lead frame includes a die pad on which a semiconductor chip is mounted, inner leads which are bonded to a bonding pad on the semiconductor chip through a wire, outer leads through which the inner leads are connected to the external circuit, and a frame which supports the die pad and the inner and outer leads.

The process for fabricating the lead frame includes forming the lead frame using a stamping process, or by forming the lead frame using an etching process. The stamping process stamps a material with a press using an alloy. The etching process uses a chemical corrosion to etch the material. In fabricating the lead frame using the stamping process, the material is located on a die and it is fixed thereon using a stripper. By stamping the material with the press, a lead frame with a given pattern is formed.

On the other hand, in forming the lead frame using the etching process, after spreading out a photoresist on the surface of the material, a given pattern is formed on the surface by exposing the material being masked to the light, and etching the material with a corrosion liquid. As a result, a lead frame with a given pattern is formed. At this time, the corrosion liquid is spread out at a given pressure from both sides of the material of the lead frame.

The lead frame of the QFP-based semiconductor package manufactured by one of the aforesaid processes includes inner leads having a substantial length and a substantially narrow width, as compared to lead frames of other types of semiconductor packages. Accordingly, when an external force is applied in the vertical direction to the length of the inner lead, the inner lead becomes easily 'transformed', i.e., the inner lead may become warped or twisted, for example.

The transformation is generated because the inner lead has a structure which is weak to the displacement of the lead in the vertical direction. Especially, as the trend of using high pins and small chips (due to the miniaturization and high integration of electronic equipment) becomes more commonplace, the pitch of the inner lead may be diminished, leading to a more severe transformation.

As described above, as the pitch of the inner leads becomes diminished, the width of the lead, and the intervals between the leads, are narrowed, and the thickness of the inner leads is reduced. Accordingly, the inner leads may become more easily curved or twisted, even with a small shock, causing a degradation in the planarity of the inner leads.

This inferiority could occur at anytime during the process of manufacture and carriage of the lead frames, and/or during the process of applying the lead frame to a molding process. Accordingly, it is desirable to be able to substantially prevent the transformation of the lead frame from occurring during the manufacturing process.

Once the inner leads are transformed, the degraded inner leads influence stitch bonding process during a follow-on packaging operation, such that is may be impossible to perform a normal wire bonding. As a result, the transformation of the inner leads may be a direct cause of a reduction in package integrity, which may result in substantial, large scale decreases in productivity.

The aforesaid problem may be further explained with respect to connecting a semiconductor device to the lead frame using a bonding equipment. The equipment consists of a heater located on a heater block, and a capillary on which the wire bonding operation is performed. When a lead frame on which a semiconductor chip is mounted is located on an upper surface of the heater block, inner leads which are curved or twisted do not adhere closely to the upper surface of the heater block, and may come apart from or off of the upper surface. In the case of bonding the wire using the capillary, the capillary applies a given pressure to the inner leads. Since the inner leads have come apart from the upper surface of the heater block, the wire does not closely adhere to the inner lead, since the power supporting the inner leads is not applied to the bottom of these inner leads. Accordingly, the wire that is attached to inner leads with inferior planarity may become easily separated from the inner leads, thereby causing inferior bonding between leads and wire.

On the other hand, when the wire is bonded to the inner leads, a given length of the wire is exposed to the outside environment of the capillary, and an electrical shock is applied to the exposed wire. Thereafter, a bonding ball (such as a solder ball) is formed at a terminal of the capillary. The bonding ball is attached to the semiconductor chip.

However, when the wire is bonded to curved or twisted inner leads, the bonding ball cannot be adequately formed at the terminal of the capillary, or a bonding ball is formed that is smaller than a desired or expected size. This happens because the curved or twisted inner leads move up with the capillary due to the elasticity, such that the leads push the wire (which is exposed to the terminal of the capillary) to the inside of the capillary. If a bonding ball with a desired size cannot be formed at the terminal of the capillary as described above, the bonding equipment must be shut down. As a result, in the case of having a large number of curved or twisted inner leads, the bonding equipment is frequently downed, thereby causing reductions in productivity.

SUMMARY OF THE INVENTION

An exemplary embodiment of the present invention is directed to a lead frame. The lead frame may include a die pad, a tie bar supporting the die pad, and a plurality of leads. The leads may include inner and outer leads arranged along an outer periphery of the die pad, with each of the inner and outer leads having tip terminals. The lead frame may include a connecting bar connected to tip terminals of each of the inner leads.

Another exemplary embodiment is directed to a method for fabricating a semiconductor package. The package may include a lead frame having a die pad, inner and outer leads arranged along an outer periphery of the die pad and having tip terminals, and a connecting bar for connecting tip terminals of the inner leads to the die pad. In the method, a bonding pad of a semiconductor chip is mounted on the die pad and connected via a conductive wire to the inner leads of the lead frame. The semiconductor chip, wire and inner leads may be subjected to a molding process, and the connecting bar which connects the tip terminals of the inner leads may be cut so as to independently separate each of the inner leads from the die pad.

BRIEF DESCRIPTION OF THE DRAWINGS

The above and other objects, features and other advantages of the present invention will be more readily apparent from the description of the exemplary embodiments that follows, with reference to the attached drawings in which.

DETAILED DESCRIPTION OF THE EXEMPLARY EMBODIMENTS

Reference should now be made to the drawings, in which the same reference numerals are used throughout the different drawings to designate the same or similar components.

As will be detailed hereafter, the exemplary embodiments describe a lead frame with reduced curvedness and/or twist that may be capable of preventing bonding inferiority in a follow-on packaging operation. In an exemplary embodiment, this may be accomplished by separating inner leads into respective individual inner leads in which no electrical shock is generated, and by changing design of the lead frame so that a tip terminal of the inner lead can be fixed to a connecting bar. The connecting bar may be cut prior to, or after, a molding process, potentially enhancing productivity in manufacturing a package including the lead frame by avoiding bonding equipment downtime due to transformation of the inner leads.

Figure 1:
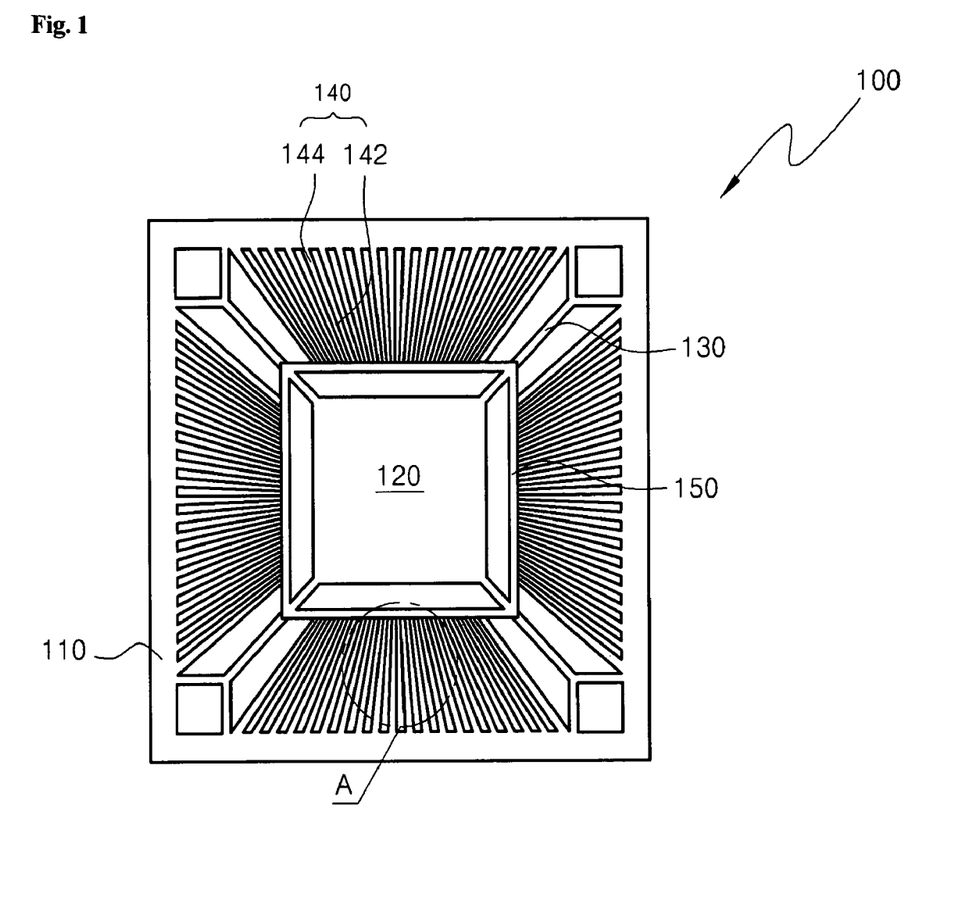
FIG. 1 is a plan view illustrating a structure of a lead frame in accordance with an exemplary embodiment of the present invention.
Figure 2:
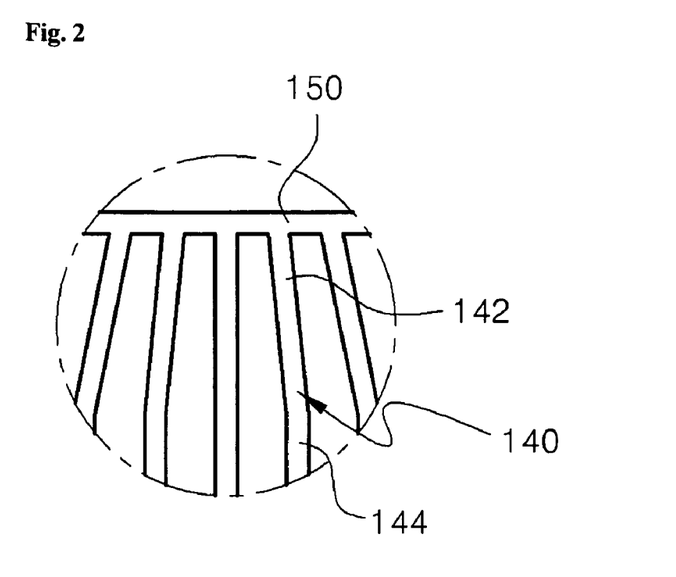
FIG. 2 is a detailed view of a main part in which part A of FIG. 1 is enlarged.

FIG. 1 is a plan view illustrating a structure of a lead frame in accordance with an exemplary embodiment of the present invention, and FIG. 2 is a detailed view of a main part in which part A of FIG. 1 is enlarged. Referring to FIGS. 1 and 2, the lead frame 100 includes an outer frame 110 formed along an outer border of a tie bar 130 and a plurality of leads 140. The outer frame 110 supports a die pad 120, the tie bar 130 and the leads 140, so as not to be separated from the lead frame 100.

The die pad 120 is configured so as to have a semiconductor chip mounted thereon, and may be located at the center of the lead frame 100. In this exemplary embodiment, the size of the die pad 120 may be equal to the size of the semiconductor chip to be mounted thereon, or slightly larger than the semiconductor chip.

The tie bar 130 may extend from each edge of the die pad 120 to the frame 110. The tie bar 130 may be designed to fixedly attach the die pad 120 to the outer frame 110 so that the die pad 120 cannot be separated from the lead frame 100.

Each of the leads 140 may electrically connect the semiconductor chip to be mounted on the die pad 120 to an external circuit, for example. A plurality of leads 140 may be arranged at a regular interval along the outer surface or periphery of the die pad 120, so as to have a given spaced distance from the edge of the die pad 120. In this exemplary embodiment, the leads 140 may be separated from one another to prevent an electrical short, for example.

The leads 140 may include inner leads 142 and outer leads 144. Inner leads 142 are connected to the semiconductor chip, and the outer leads 144 connect the inner leads 142 to the external circuit. The inner lead 142 may represent a part extending from a terminal of one side adjacent to the die pad 120 to a part to be encapsulated by a molding resin in a semiconductor package process (such as a molding process) which will be explained in further detail below. The outer lead 144 may represent a part extending from a point to be exposed to an environment outside the molding resin, to the terminal of the other side of the lead 140 connected to the outer frame 110. The width of the inner lead 142 may be formed so as to be narrower than a width of the outer lead 144. Accordingly, the thinner inner leads 142 could be curved or twisted easily due to a small shock, for example. To prevent curving or twisting of the inner leads 142, each of the inner leads 142 may be connected using a connecting bar 150, as shown in FIGS. 1 and 2, for example.

The connecting bar 150 may be connected to a tip terminal of each inner lead 142. The connecting bar 150 may be formed so as to traverse the tie bar 130 along the outer surface or periphery of the die pad 120, so as to connect all the inner leads 142 thereto. On the other hand, the tip terminals of the outer leads 144 are connected to the outer frame 110.

In the case that the lead frame 100 is designed as above (i.e., where tip terminals of the outer leads 144 are connected by the outer frame 110 and tip terminals of the inner leads 142 are connected by the connecting bar 150, the endurance of the leads 140 may be enhanced. This is because the effects of a shock applied to the leads 140 is translated (separated) onto each lead 142. As a result, it may be possible to reduce or eliminate the possibility of curving or twisting of the inner leads 142 due to an applied shock.

FIGS. 3 to 6 are process flow charts illustrating a method for fabricating a semiconductor package according to an embodiment of the present invention. For reference, the process will be explained in four steps with regard to FIGS. 3-6.

Figure 3:
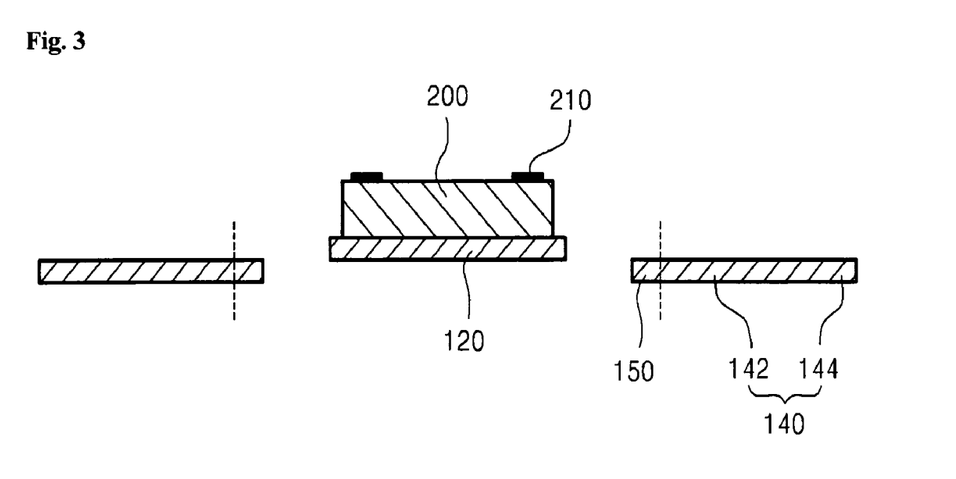
FIGS. 3 to 6 are process flow charts illustrating a method for fabricating a semiconductor package applying the lead frame of FIG. 1, in accordance with an exemplary embodiment of the present invention.

FIG. 3 is a sectional view illustrating a state in which a semiconductor chip is mounted on a die pad. As shown in FIG. 3, the lead frame 100 of FIG. 1 may be fabricated by the stamping process or by the etching process. In the case where the lead frame 100 is manufactured by the stamping process, a space between the leads 140 may be punched at a location (not shown) just before a part for tip connection, so that the tip terminals of the inner leads 142 are connected by the connecting bar 150.

On the other hand, in the case where the lead frame 100 is manufactured by the etching process, a reticle is designed in consideration of the part for tip connection, and the tip terminals of the inner leads 142 are connected to the connecting bar 150 via the etching process, using the reticle as a mask, for example. The reticle is a type of mask or photomask. A photomask is used in photolithography to block resist exposure in a selected area. A photomask may consist of chrome opaque areas supported by a high quality quartz plate that is transparent to UV radiation. A reticle is a square quartz plate with a pattern that is typically delineated in a thin chrome layer on one side of the plate. A reticle is functionally the same as a mask or photomask.

Thereafter, an epoxy-based adhesive (not shown in FIG. 3) may be spread on the die pad 120 formed as a result of one of the aforesaid processes, and a semiconductor chip 200 equipped with a bonding pad 210 may be placed on the die pad 120. At this time, the semiconductor chip 200 is mounted in a way that the surface or side of the semiconductor chip 200 that is not attached to the bonding pad 210 contacts the die pad 120. As a result, the semiconductor chip 200 may be attached (Step 1) to the die pad 120.

Figure 4:
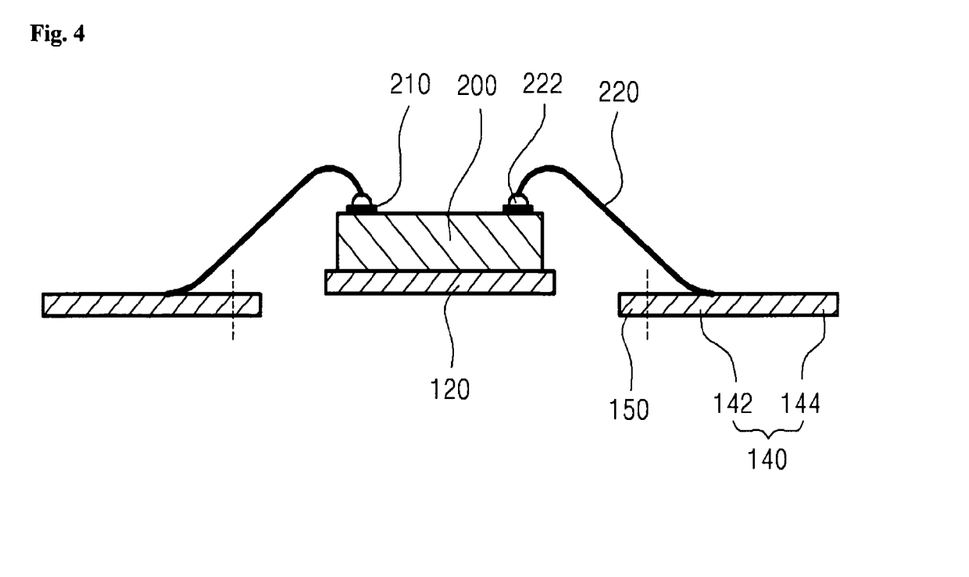

FIG. 4 is a sectional view illustrating a state in which an inner lead is electrically connected to a semiconductor chip. When the semiconductor chip has been attached as shown in FIG. 3, the lead frame 100 is moved to a wire bonding equipment. The wire bonding equipment includes a heater block (not shown in FIG. 4) for generating heat at a given temperature during the wire bonding process, and a capillary (not shown) for electrically connecting bonding pads 210 of the semiconductor chip 200 to the inner leads 142 by forming a conductive wire 220, as shown in FIG. 4.

The lead frame 100 to which the semiconductor chip 200 is attached is placed on the heater block of the wire bonding equipment. At this time, as all the inner leads 142 are connected by connecting bar 150, the inner leads 142 do not come apart from an upper surface of the heater block.

When the lead frame 100 is placed on the heater block, a wire with a given length is exposed to a terminal of the capillary. In the case where an electrical spark is applied to the exposed wire, the wire becomes deformed in shape (to a shape somewhat similar to a drop of water, for example) and forms a bonding ball 222. As there are no curved or twisted inner leads 142 (due to the connecting bar 150), the bonding ball 222 may be formed at a desirable size, continuously at the capillary. The capillary attaches the bonding ball 222 to the bonding pad 210 of the semiconductor chip 200, exposes the conductive wire 220, and then moves to the inner lead 142 with a given curvature.

Thereafter, the capillary electrically connects (Step 2) the semiconductor chip 200 to the inner leads 142 via the conductive wire 220 (a portion of which is exposed) by applying pressure to a given part of the inner lead 142. This process is repeated until the bonding pad 210 of the semiconductor chip 200 and each of the inner leads 142 are connected. In this case, as no curved or twisted inner leads 142 exist, due to the connecting bar 150, the wire 220 may be firmly attached to all inner leads 142. Accordingly, FIG. 4 illustrates the resulting structure in which the bonding pad 210 is connected to the inner leads 142 through the conductive wire 220.

Figure 5:
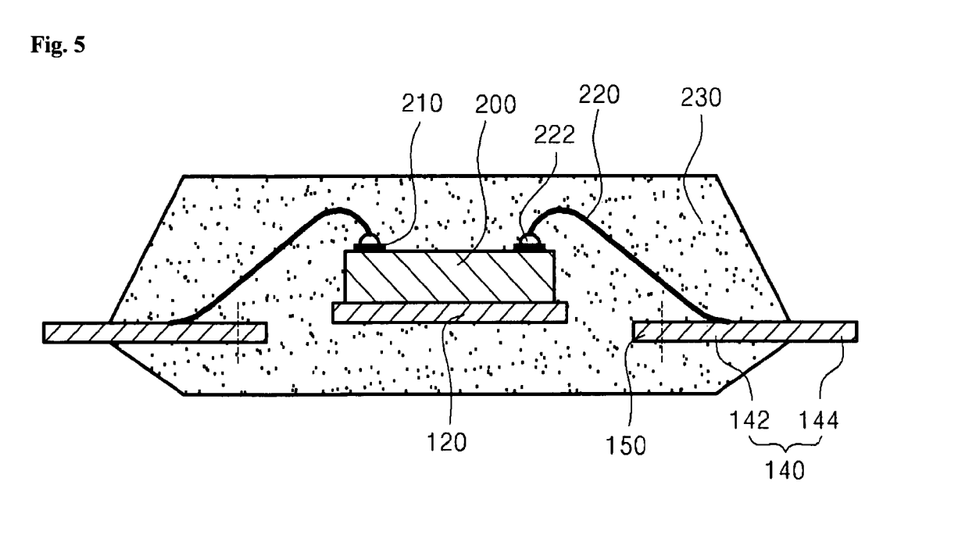

FIG. 5 is a sectional view illustrating a state in which the semiconductor chip, lead frame and a wire are molded by a molding resin. As shown in the FIG. 5, the semiconductor chip 200, wire 220 and the inner leads 142 are molded and hardened (Step 3) with a molding resin 230. The molding resin 230 may be any suitable resin or ceramic such as a liquid epoxy resin, buffer coating resin, etc., which protects the semiconductor chip 200, wire 220 and inner leads 142 from the external environment.

Figure 6:
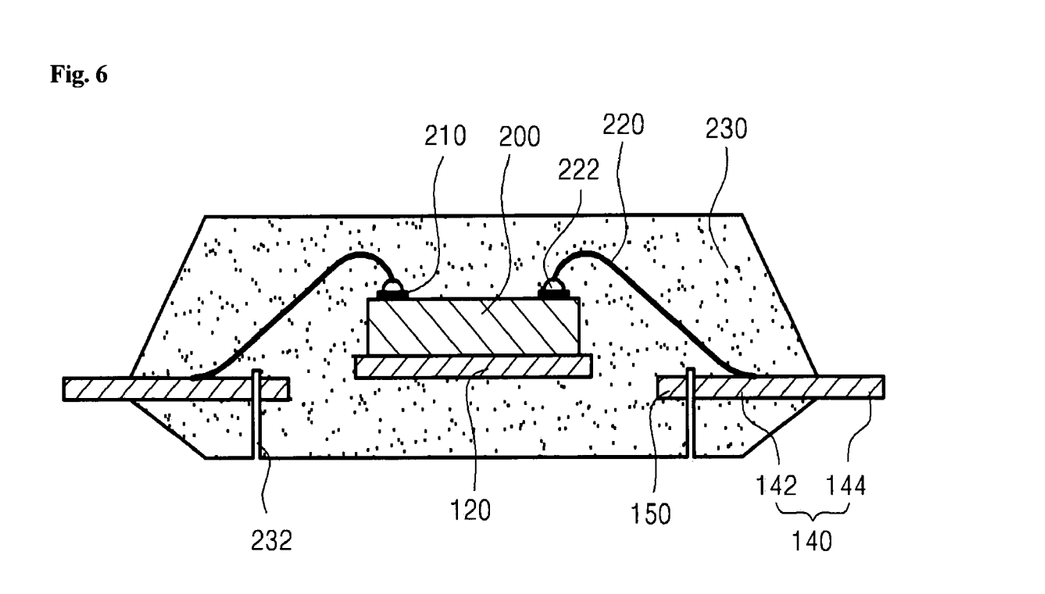

FIG. 6 is a sectional view illustrating a state in which a connecting bar is cut by a cutting unit. FIG. 6 is a sectional view which is cut along the dotted line B-B of FIG. 7. To prevent the electrical short from occurring when the inner leads 142 are connected, the connecting bar 150 is cut (Step 4) with a suitable sawing equipment. As a result, the inner leads 142 may be separated into respective individual leads with no electrical short, as shown in FIG. 6, for example.

At this time, the connecting bar 150 may be cut by a sawing blade or laser. The process for cutting the connecting bar 150 may be performed by cutting a bottom surface of the package. This may be done by reversing the package after completing the molding process, in the moving direction of the sawing equipment, for example. This is shown in further detail below.

Figure 7:
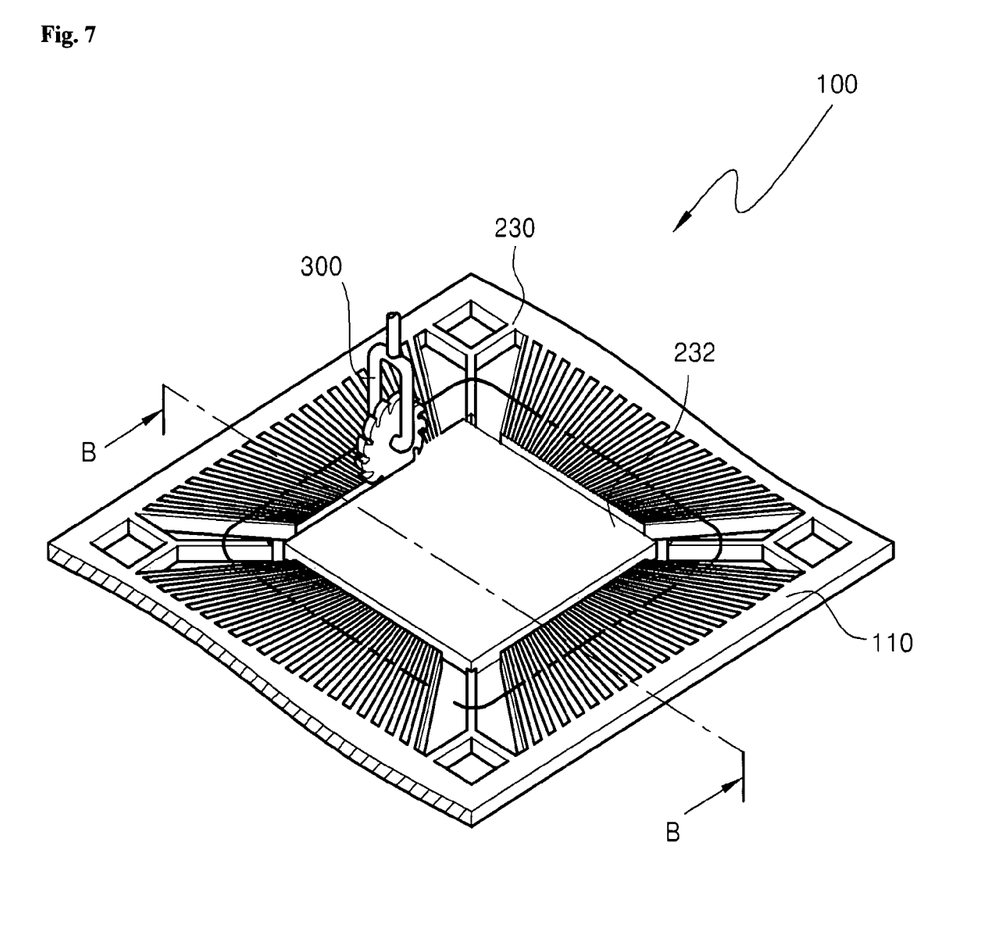
FIG. 7 is a perspective view illustrating a process of cutting the connecting bar of the lead frame by the cutting unit, in accordance with an exemplary embodiment of the present invention.

FIG. 7 is a perspective view illustrating a process of cutting the connecting bar of the lead frame by the cutting unit, in accordance with an exemplary embodiment of the present invention. For ease of understanding, in FIG. 7, there is shown a perspective view illustrating a process of how the connecting bar 150 of the lead frame 100 is cut by the sawing equipment. With reference to the drawing, the sawing work will be explained in detail. The part shown in dotted line indicates a part in which the molding resin is molded.

The cutting equipment (such as a blade 300) may be positioned at a place corresponding to the tip terminal of the inner leads 142 in the bottom area of the package which is reversed, as illustrated in FIG. 7. After that, the blade 300 cuts a part from the molding resin to the connecting bar 150. When the connecting bar 150 is cut by the blade 300, as illustrated in FIG. 7, a cut groove 232 having a shape that is similar to the shape of the die pad 120 is formed at the bottom of the part of the package molded by the molding resin 230.

As shown in FIG. 7, within the cut groove formed at the bottom of the package, the connecting bar 150 (or the tie bar 130) which connects the die pad 120 to the outer frame 110 is cut together. As a result, the inner leads 142 are separated into respective individual leads, so as to avoid formation of an electrical short, as more accurately illustrated in FIG. 6.

After the connecting bar 150 is cut, the outer frame 110 is cut and the outer leads 144 are independently separated. Thereafter, the outer leads 144 may be formed in an angular shape so that the semiconductor package (which is separated) can be mounted to the electronic equipment, thereby completing the fabrication process.

By performing the packaging process as explained above, even though an external force is applied to the lead frame prior to the wire bonding process, the external force may be scattered through the connecting bar. Accordingly, the possibility of imparting a curve or twist to the inner leads 142 can be substantially reduced, possibly preventing or substantially avoiding fall-off in productivity caused by downtime of the bonding equipment.

As described above, the connecting bar 150 which connects the inner leads is cut after molding the semiconductor chip 200 with the molding resin 230. As an alternative process, however, the cutting process for cutting the connecting bar 150 can be performed after the wire bonding process, and prior to the molding process. In this case, the tie bar 130 which supports the die pad 120 should not be cut so that the die pad 120 cannot be separated from the lead frame 100.

As described above, the exemplary embodiments of the present invention describe a method which performs the wire bonding process in a state in which the inner leads 142 are all connected through the connecting bar 150. Thereafter, the connecting bar is cut (prior to or after a molding process) and the inner leads are separated into the respective individual leads. As a result, even if an external force is applied to the lead frame 100 prior to the wire bonding process, it is possible to minimize the curvedness or twist of the inner leads 142, thereby maintaining bonding integrity of the leads 142. In addition, downtime of the bonding equipment due to curved or twisted leads 142 may be prevented, possibly enhancing productivity.

Accordingly, the exemplary embodiments of the present invention describe a lead frame and a method for fabricating a semiconductor package employing the same, which may reduce a transformation (e.g., warping, twisting, etc.) of inner leads, thus preventing poor bonding and potentially improving the productivity thereof through a design change in the lead frame.

The exemplary embodiments of the present invention having been described in an illustrative manner, it is to be understood that the terminology used is intended to be in the nature of description rather than of limitation. Many modifications and variations of the exemplary embodiments of the present invention are possible in light of the above teachings. Therefore, it is to be understood that within the scope of the appended claims, the exemplary embodiments of the present invention may be practiced otherwise than as specifically described above.

What is claimed is:

1. A method for fabricating a semiconductor package, comprising:

preparing a lead frame, the lead frame including a die pad, inner and outer leads arranged along an outer periphery of the die pad and having tip terminals, and a connecting bar for connecting tip terminals of the inner leads, the connecting bar being deposited around the die pad, each one end of an inner lead being connected to the connecting bar and each other end of the lead being connected to an outer lead;

mounting a bonding pad of a semiconductor chip on the die pad;

connecting the bonding pad to at least one tip terminal of an inner lead via a wire;

molding the semiconductor chip, wire and inner leads; and cutting the connecting bar which connects the tip terminals of the inner leads so as to independently separate each of the inner leads from the die pad, the molding occurring after the connecting of the bonding pad to at least one terminal, the cutting occurring after the connecting of the bonding pad to at least one tip terminal.

2. The method of claim 1, wherein preparing the lead frame includes fabricating the lead frame by one of a stamping process or an etching process.

3. The method of claim 1, wherein the connecting bar is cut by one of a sawing blade or a laser.

4. The method of claim 1, wherein cutting the connecting bar further includes cutting a bottom surface of the package by reversing the package, after the package is subject to the molding process, in the moving direction of a sawing device that cuts the connecting bar.

5. A method for fabricating a semiconductor package, comprising:

preparing a lead frame, the lead frame including a die pad, inner and outer leads arranged along an outer periphery of the die pad and having tip terminals, and a connecting bar for connecting tip terminals of the inner leads, the connecting bar being deposited around the die pad, each one end of an inner lead being connected to the connecting bar and each other end of the lead being connected to an outer lead;

mounting a bonding pad of a semiconductor chip on the die pad;

connecting the bonding pad to at least one tip terminal of an inner lead via a wire;

cutting the connecting bar which connects the tip terminals of the inner leads so as to independently separate each of the inner leads from the die pad and from each other; and molding the semiconductor chip, wire and the inner leads with molding resin, the molding occurring after the connecting of the bonding pad to at least one terminal, the cutting occurring after the connecting of the bonding pad to at least one tip terminal.

6. A method for fabricating a semiconductor package that includes a lead frame, the lead frame having a die pad, inner and outer leads arranged along an outer periphery of the die pad and having tip terminals, and a connecting bar for connecting tip terminals of the inner leads to the die pad, the method comprising:

connecting, via a conductive wire, a bonding pad of a semiconductor chip to be mounted on the die pad of the lead frame to the inner leads of the lead frame, the connecting bar being deposited around the die pad, each one end of an inner lead being connected to the connecting bar and each other end of the lead being connected to an outer lead;

molding the semiconductor chip, wire and inner leads; and cutting the connecting bar which connects the tip terminals of the inner leads so as to independently separate each of the inner leads from the die pad, the molding occurring after the connecting, the cutting occurring after the connecting.

7. The method of claim 6, wherein said molding is performed prior to said cutting.

8. The method of claim 6, wherein said cutting is performed prior to said molding.

* * * * *